United States Patent
Kaizuka

(10) Patent No.: US 7,285,995 B2
(45) Date of Patent: Oct. 23, 2007

(54) CHARGE PUMP

(75) Inventor: Masao Kaizuka, San Jose, CA (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 211 days.

(21) Appl. No.: 11/049,421

(22) Filed: Feb. 2, 2005

(65) Prior Publication Data

US 2005/0184774 A1    Aug. 25, 2005

Related U.S. Application Data

(60) Provisional application No. 60/541,439, filed on Feb. 2, 2004.

(51) Int. Cl.
*H03L 7/06* (2006.01)

(52) U.S. Cl. ..................................... 327/157

(58) Field of Classification Search ........ 327/147–148, 327/156–157
See application file for complete search history.

(56) References Cited

U.S. PATENT DOCUMENTS

| | | | | |
|---|---|---|---|---|
| 5,144,156 A | * | 9/1992 | Kawasaki | 327/157 |
| 6,114,906 A | * | 9/2000 | Fukui | 330/252 |
| 6,526,111 B1 | * | 2/2003 | Prasad | 375/376 |
| 6,853,253 B2 | * | 2/2005 | Desortiaux | 331/16 |
| 7,012,473 B1 | * | 3/2006 | Kokolakis | 331/17 |
| 2005/0185746 A1 | * | 8/2005 | Jung | 375/374 |

* cited by examiner

*Primary Examiner*—Quan Tra
(74) *Attorney, Agent, or Firm*—Tucker Ellis & West LLP

(57) ABSTRACT

A charge pump that employs a differential amplifier that provides a differential output to control a charge up current source and a charge down current source. The differential amplifier is configured so that the current sources can maintain substantially equal charge up current and charge down current irrespective of the voltage at its output terminal.

9 Claims, 6 Drawing Sheets

CHARGE PUMP

CROSS-REFERENCE TO RELATED APPLICATIONS

This application claims the benefit of priority of U.S. Provisional Application No. 60/541,439 filed Feb. 2, 2004.

BACKGROUND OF THE INVENTION

The present invention is directed to communications systems, and more particularly to a system and method for controlling the difference between charge-up and charge-down currents in a charge pump circuit.

In modem communications systems, bidirectional data is transmitted in digital format. Transmission of data in digital, as opposed to analog, form has numerous advantages, mainly the ability to recreate the data at the receiver. Analog transmissions are affected by various problems, as is well documented in the art. However, digital transmissions are easily reconstituted at the receiver, provided the receiver is able to regenerate the transmission with the fewest number of bit errors. This requires the receiver to sample the transmission at an optimal rate and at an optimum time. To conserve bandwidth, digital data transmissions typically combine the data itself with a clock signal. In order to retrieve the clock signal from the transmission, a phase locked loop is used for clock signal recovery.

A phase locked loop is an electronic circuit with a voltage or current controlled oscillator that is constantly adjusted to match, in phase, the frequency of an input signal. In addition to stabilizing a particular communications channel, a phase locked loop may be used to generate a signal, modulate or demodulate a signal, reconstitute a signal with less noise, or multiply or divide a frequency. In other words, phase locked loops compare the frequency and/or phase of an incoming datastream to a periodic reference clock signal generated by an oscillator circuit, and to adjust the oscillator circuit until its output matches, in both frequency and phase, the data signal. This generates a reference clock which controls operation of the remainder of the circuit, thereby allowing for the regeneration of the incoming data signal. Typical phase locked loop circuits are manufactured as integrated circuits.

The phase locked loop normally consists of a phase detector, a charge pump circuit, a loop filter and a voltage controlled oscillator. The phase detector is a device that compares two input frequencies, generating an output that is a measure of their phase difference. For example, if the two input signals differ in frequency, the phase detector gives a periodic output at the difference frequency. Thus, upon receiving a data signal at a data input of the phase detector, the detector compares, in time, the data signal's rising edge with the rising edge of an output signal of the voltage controlled oscillator.

For example, if the phase detector determines that the input signal leads the voltage controlled oscillator signal, it will direct the charge pump to increase the current into the voltage controlled oscillator, thereby increasing the voltage controlled oscillator signal. In the event that the datastream lags the voltage controlled oscillator signal, the phase detector will direct the charge pump to decrease the amount of current flowing into the voltage controlled oscillator. In essence, the charge pump sources or sinks a particular amount of current to or from the loop filter. The voltage is thus used to control the operational frequency of the voltage controlled oscillator. The operational frequency of the voltage controlled oscillator is thus increased or decreased to reduce phase lead or phase lag of the inputs to the phase detector.

Referring now to FIG. 1, there is shown a simplified illustration of a phase locked loop circuit 100 comprising a charge pump 140. Charge pump 140 comprises transistors 102, 104, 106 and 108. Transistors 102 and 108 are used to generate a constant current. A first voltage 132 is applied to the gate of transistor 102 and a second voltage 134 is applied to gate of transistor 108 which control the amount of current supplied by transistors 102 and 108 respectively. Transistors 104 and 106 operate as switches, acting as switches for connecting transistors 102 and 108 respectively to the output terminal 130 of the charge pump which is connected to the input terminal VCNT 112 of voltage controlled oscillator VCO 110. As shown in FIG. 1, the voltage at output terminal 130 will take various voltages, depending upon the operating frequency of VCO 110. UP switches transistor 104 on when the voltage at output terminal 130 needs to be increased, while DOWN switches transistor 106 on to decrease the voltage at output terminal 130. A phase locked loop filter 114 is operatively coupled between output terminal 130 of to the VCNT terminal 112 is a phase locked loop filter 114. The phase locked loop filter 114 comprises capacitance 116, resistance 118 and capacitance 120. It will be appreciated by those skilled in the art that the corresponding values of the resistance and capacitance will be readily ascertainable during the building of the circuit.

The voltage at VCNT 112 of VCO 110 depends on the frequency generated by VCO 110. This can cause a variance in the current generated by either transistor 102 and transistor 108. This is because a real transistor's characteristic curve is not perfect. A real transistor's current has some dependency on the voltage between its drain and source. The absolute value of the current source affects the filter characteristic of the phased locked loop and the difference between the pull-up current and the pull-down current result in a phase offset of the phase locked loop. For example, if VCNT is decreasing, as it approaches ground voltage, the current from transistor 108 becomes weak, which creates a corresponding phase offset in phase locked loop 100. Similarly, if VCNT increased and approaches VDD, the current from transistor 102 becomes weak and will create a phase offset in phase locked loop 100.

BRIEF SUMMARY OF THE INVENTION

A charge pump, in accord with the present invention, comprises a first current source, a second current source and a differential amplifier. The first current source is connected to an output node for sourcing current to the output node. The second current source is connected to the output node for sinking current from the output node. The differential amplifier produces first and second differential outputs based on an output voltage at the output node. The first differential output is coupled to the first current source and controls the first current source. The second differential output is coupled to the second current source and controls the second current source. Alternatively, the differential outputs can be based on the output voltage and a reference voltage. A switch network can be used to regulate the currents from the first and second current sources to the output node.

In accordance with an aspect of the present invention, there is disclosed herein a method for implementing a charge pump. The method comprising obtaining a pair of differential outputs from a reference voltage and an output voltage.

A first current from a first current source is controlled by a first output from the pair of differential outputs. A second current from a second current source is controlled by a second output from the pair of differential outputs. The desired output is obtained by combining the first current and a second current.

Still other objects of the present invention will become readily apparent to those skilled in this art from the following description wherein there is shown and described a preferred embodiment of this invention, simply by way of illustration of one of the best modes best suited for to carry out the invention. As it will be realized, the invention is capable of other different embodiments and its several details are capable of modifications in various obvious aspects all without from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification, illustrates several aspects of the present invention, and together with the description serve to explain the principles of the invention.

DETAILED DESCRIPTION OF INVENTION

Figure 1:
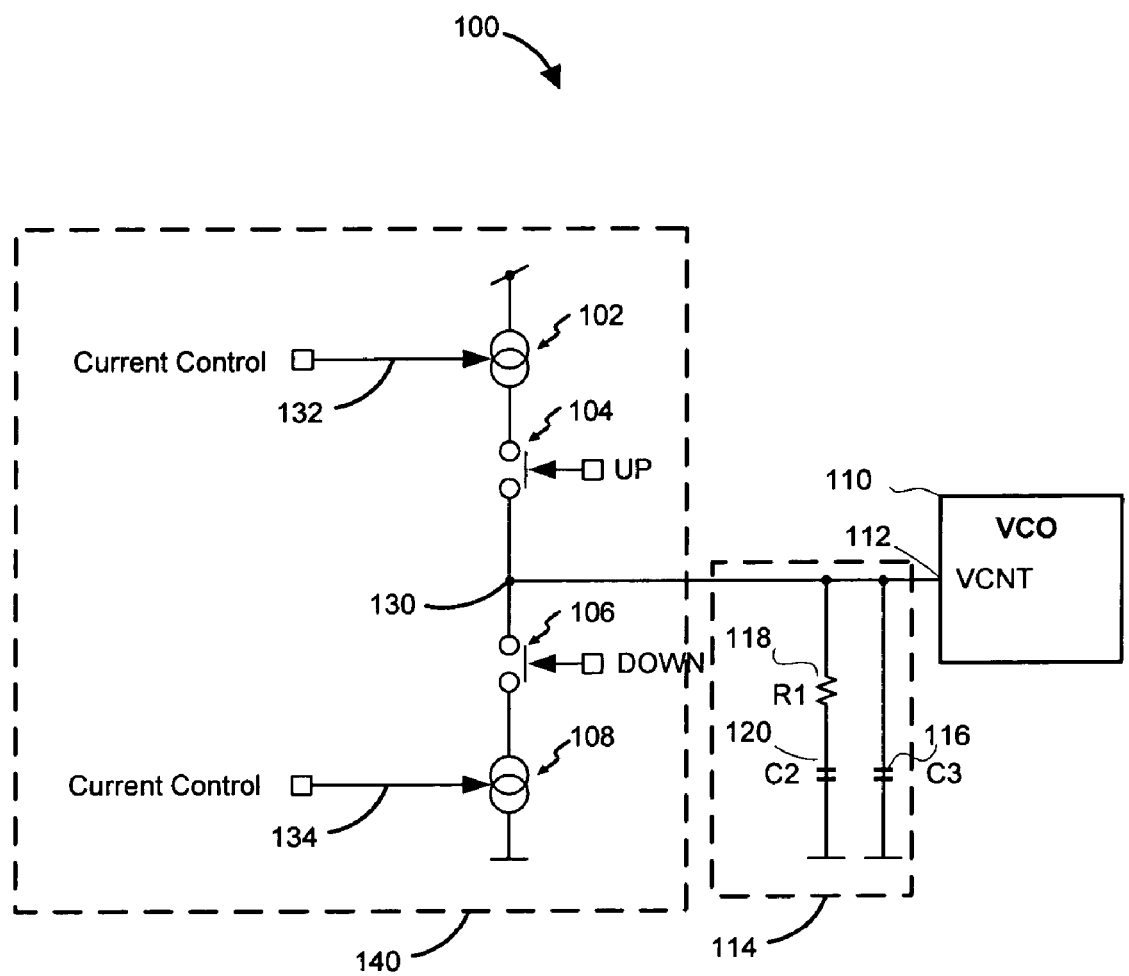
FIG. 1 is a simplified illustration of a phase locked loop comprising a charge pump.

Throughout this description, the preferred embodiment and examples shown should be considered as exemplars, rather than limitations, of the present invention. The present invention comprises a charge pump that can maintain charge up and charge down current regardless of the voltage at its output terminal. Referring to FIG. 1 for example, the charge pump of the present invention can maintain current through transistor 102 and/or 104 irrespective of voltage VCNT 112 at VCO 110.

Figure 2:
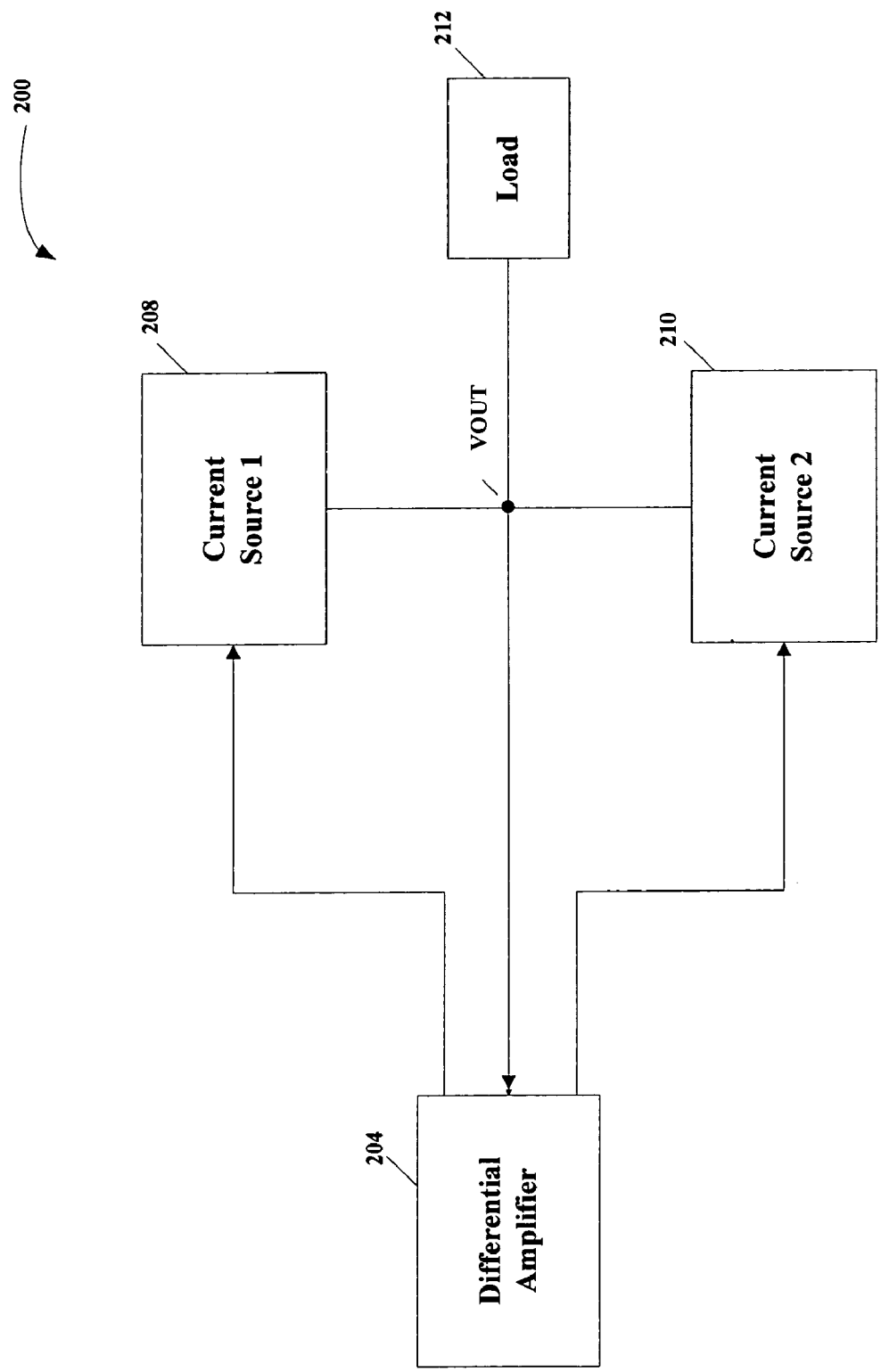
FIG. 2 is a block diagram illustrating a charge pump in accordance with an aspect of the present invention.

FIG. 2 is a block diagram illustrating a charge pump 200 in accordance with an aspect of the present invention. A differential amplifier 204 receives input from an output node VOUT that is coupled to load 212. VOUT is coupled to two current sources, 208 and 210. Current sources 208 and 210 are used to source or sink current in order to maintain the voltage at VOUT. VOUT is input into differential amplifier 204, which produces two differential outputs based on VOUT. One of the differential outputs is connected to current source 208 and controls current source 208. Another differential output from amplifier 204 is connected to current source 210 and controls current source 208.

Another voltage source, such as a reference voltage can be used by differential amplifier 204 to produce the differential outputs. A voltage follower can be connected between the output voltage and the reference voltage if desired. For example, the voltage source can be an operational amplifier with one input coupled to the reference voltage and the other input coupled to the output voltage, and a feedback loop connecting the output to one of the inputs. Also, amplifier 204 can be biased by a constant source, e.g., a constant voltage or current source.

Load 212 can be a voltage controlled oscillator, for example when the charge pump is used in a phase locked loop. In a phase locked loop, load 212 can further comprise a filter.

Switch networks can be used to regulate the amount of current from each source 208, 210 is supplied to VOUT. A first switch network can be coupled to current source 208 and a second switch network can be coupled to current source 210.

Figure 3:
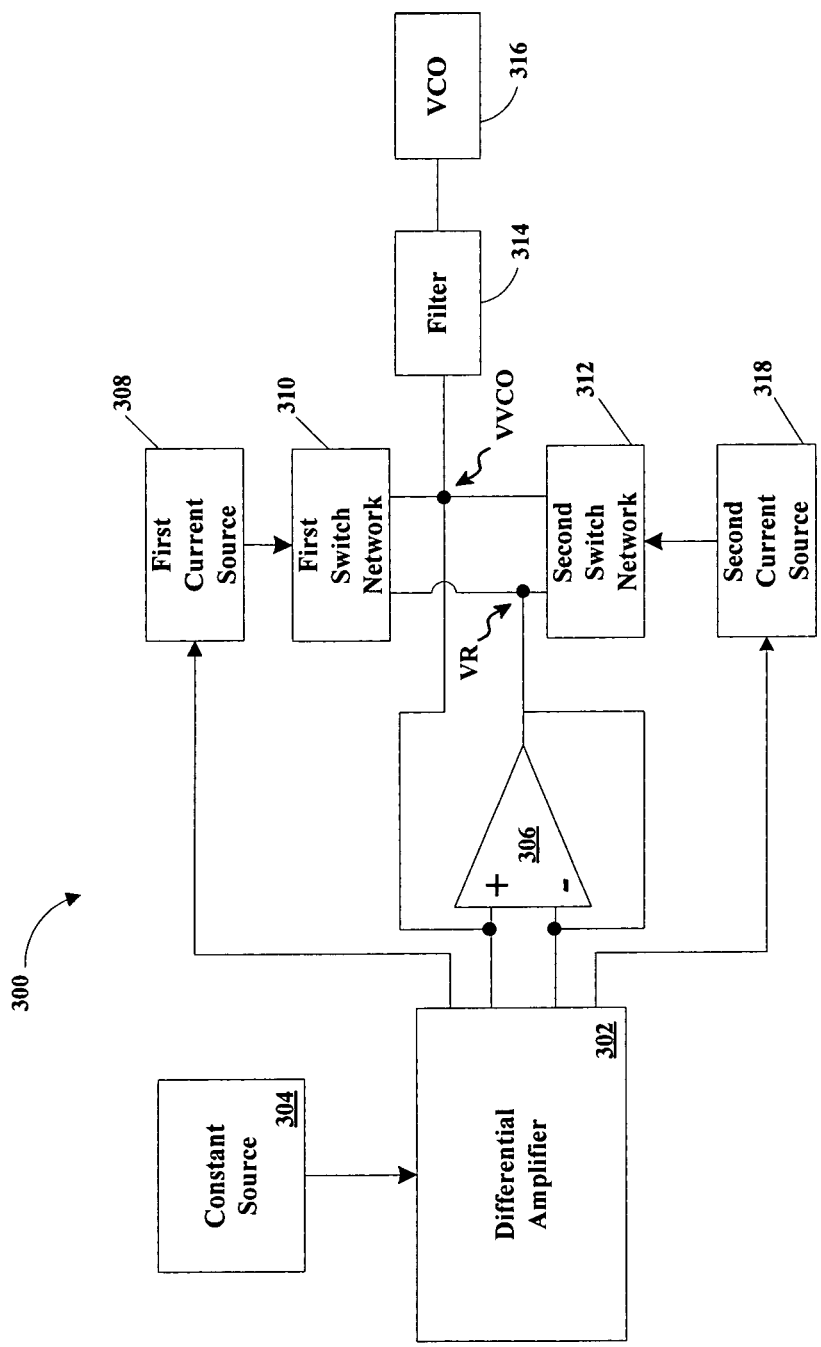
FIG. 3 is a block diagram of a charge pump in accordance with an aspect of the present invention.

FIG. 3 is a block diagram of a charge pump 300 in accordance with an aspect of the present invention. The charge pump is formed by current sources 304, 306, 308, 318, differential amplifier 302, first switch network 310 and second switch network 312.

Differential amplifier 302 receives a reference voltage VR and the charge pump output voltage VVCO. Differential amplifier 302 functions as a voltage follower, where VR the reference voltage is fedback to one input (+) of differential amplifier 302 and VVCO is fedback into the other input (−) of operational amplifier 302. Differential amplifier 302 produces two outputs. One output from differential amplifier 302 is used to control first current source 308 that produces a first current, and is used to control third current source 304 that produces a third current. The other output from differential amplifier 302 is used to control second current source 318 that produces a second current, and is used to control a fourth current source 306. First switch network 310 distributes the first current between VR and VVCO. The current can be distributed such that only one of VR and VVCO receives the first current, or can be distributed so that each of VR and VVCO receive a percentage of the first current. Similarly, second switch network 312 distributes the second current to VR and VVCO. The second current can be distributed such that only one of VR and VVCO receives current or can be distributed so that each of VR and VVCO receive a percentage of the current from the second current source.

Figure 4:
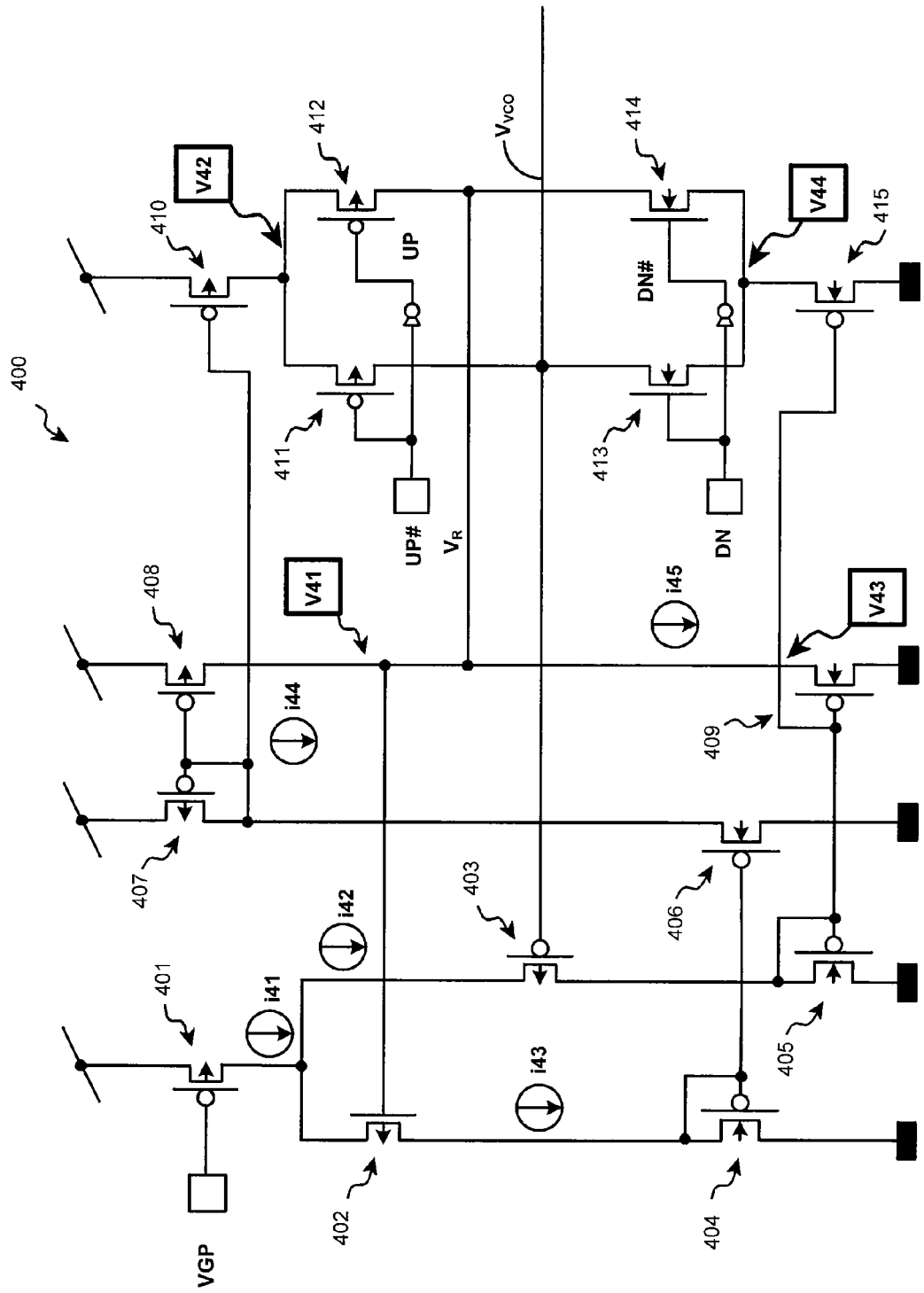
FIG. 4 is a circuit diagram of a charge pump in accordance with an aspect of the present invention.

FIG. 4 is a circuit diagram of a charge pump 400 in accordance with an aspect of the present invention. Terminal VGP is a voltage reference for transistor 401 that produces an initial constant current for differential amplifier comprising transistors 402, 403, 404, 405, 406, 407, 408 and 409. Transistor 405 forms a current mirror with transistors 409 and 415 and generates a voltage reference for obtaining a constant current through transistors 409 and 415. Similarly, transistor 407 generates a voltage reference to obtain constant currents through transistors 408 and 410. In addition, transistors 408 and 409 form an output stage of an operation amplifier employed as a voltage follower for VR and VVCO with transistors 402 and 403 forming the inputs. Transistors 410 and 415 form the output stage of charge pump 400. The output of charge pump 400 is VVCO.

Transistors 411 and 412 form a first switch network for switching current from transistor 410 to nodes VVCO and VR respectively. The UP terminal is employed for controlling transistors 411 and 412. Similarly, transistors 413 and 414 form a second switch network for switching current from transistor 415 to nodes VVCO and VR respectively. The DN terminal is used to control transistors 413 and 414.

In operation, when a charge up condition occurs, that is more current needs to be supplied to VVCO, the current source is supplied by transistor 410 and switched through transistor 411. When a charge down condition occurs, that is current is to be sunk from VVCO, then current from transistor 415 is routed through transistor 413. At steady state, voltages V41 and V42 will be substantially the same as V43 and V44. Assuming the current source flow through transistor 401 (I41) is value m, then I42 and I43 will be m/2 because of the differential nature of the amplifier. When VR and VVCO are substantially the same, then I44 and I45 are also substantially equal.

Because transistor 409 and 415 have the same applied gate voltage and drain voltage, the current per channel width will be substantially equal. Likewise, because transistors 408 and 410 have the same applied gate voltage and drain voltage, the current per channel width will be substantially equal.

By this configuration, the charge pump current for charge up and charge down will be kept substantially equal irrespective of the voltage at VVCO.

Figure 5:
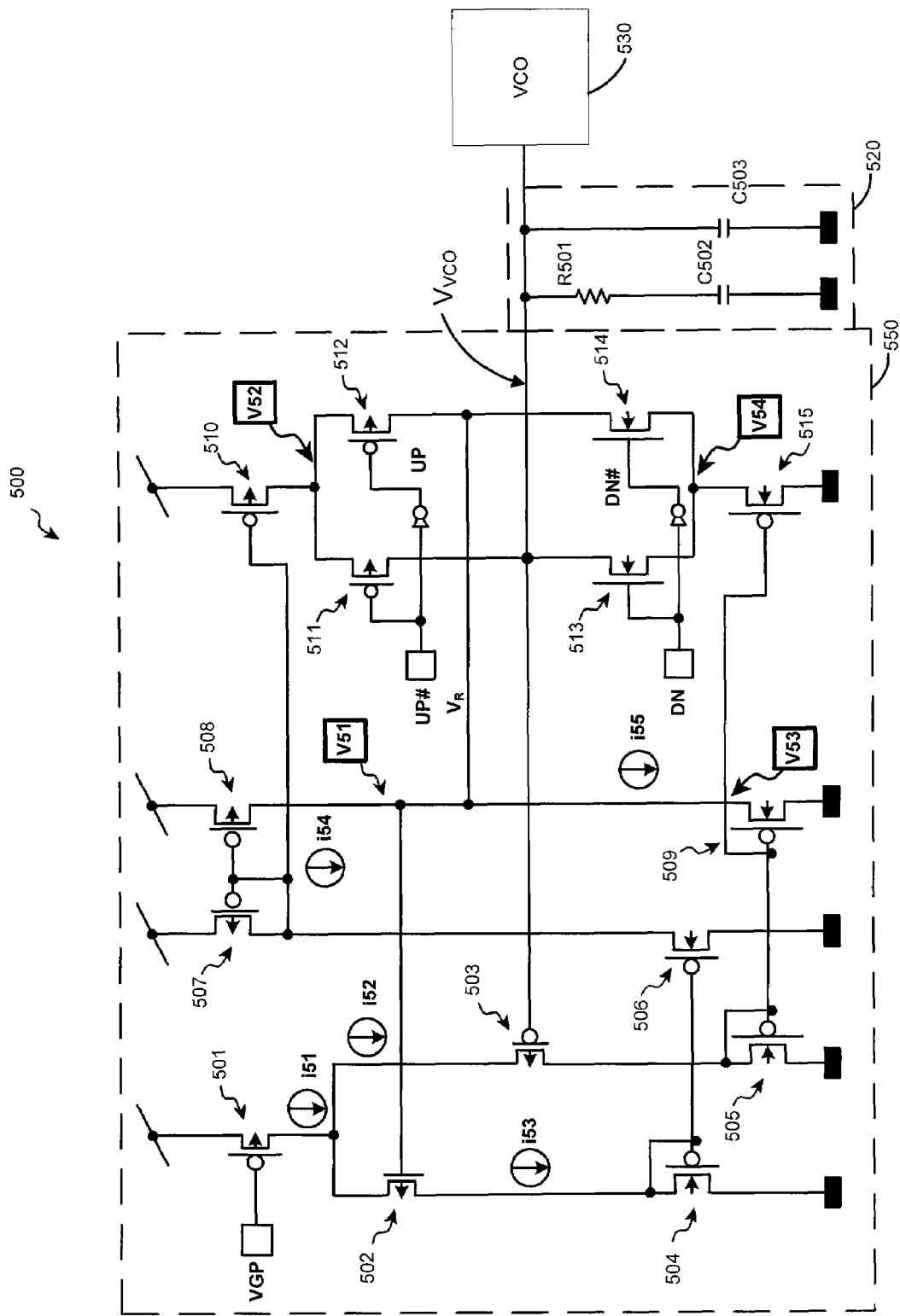
FIG. 5 is a circuit diagram of a phase locked loop in accordance with an aspect of the present invention.

Referring now to FIG. 5, there is illustrated a circuit diagram of a phase locked loop 500 in accordance with an aspect of the present invention. Terminal VGP is a voltage reference for transistor 501 that produces an initial constant current for differential amplifier comprising transistors 502, 503, 504, 505, 506, 507, 508 and 509. Transistor 505 forms a current mirror with transistors 509 and 515, and generates a voltage reference for obtaining a constant current through transistors 509 and 515. Similarly, transistor 507 generates a voltage reference to obtain constant currents through transistors 508 and 510. In addition, transistors 508 and 509 form an output stage of an operation amplifier employed as a voltage follower for VR and VVCO with transistors 502 and 503 forming the inputs. Transistors 510 and 515 form the output stage of charge pump 500. The output of charge pump 500 is VVCO, which is coupled to phase locked loop filter 520 and the input of VCO 530. Phase locked loop filter 520 comprises R501, C502 and C503.

Transistors 511 and 512 form a first switch network for switching current from transistor 510 to nodes VVCO and VR respectively. The UP terminal is employed for controlling transistors 511 and 512. Similarly, transistors 513 and 514 form a second switch network for switching current from nodes VVCO and VR respectively. The DN terminal is used to control transistors 513 and 514.

In operation, when a charge up condition occurs, that is more current needs to be supplied to VVCO, the current source is supplied by transistor 510 and switched through transistor 511. When a charge down condition occurs, that is more current needs to be sunk from VVCO, then current from transistor 515 is routed through transistor 513. Voltages V51 and V52 will be the same as V53 and V54. Assuming the current source flow through transistor 501 (I51) is value m, then I52 and I53 will be m/2 because of the differential nature of the amplifier. When VR and VVCO are substantially the same, then I54 and I55 are substantially equal.

Because transistor 509 and 515 have the same applied gate voltage and drain voltage, the current per channel width will be substantially equal. Likewise, because transistors 508 and 510 have the same applied gate voltage and drain voltage, the current per channel width will be substantially equal.

By this configuration, the charge pump current for charge up and charge down will be kept substantially equal irrespective of the voltage at VVCO.

Figure 6:
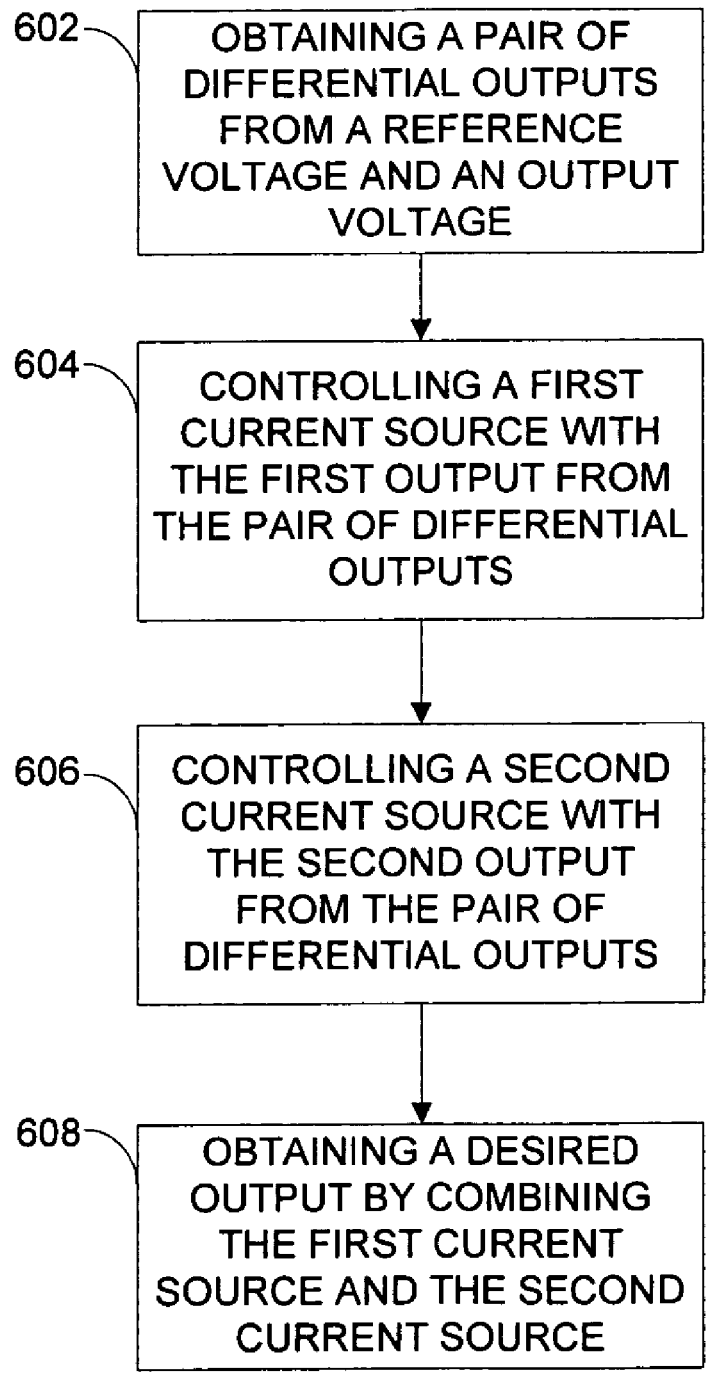
FIG. 6 is a block diagram of a method in accordance with an aspect of the present invention.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

Referring now to FIG. 6, there is illustrated a block diagram of a method 600 for implementing a charge pump in accordance with an aspect of the present invention. The method 600 begins at 602 by obtaining a pair of differential outputs from a reference voltage and an output voltage. A differential amplifier can be used to obtain the differential outputs. The reference voltage can be a voltage used for comparing the output voltage or can be a static or set voltage, e.g., ground or a source voltage. At 604, a first current from a first current source is controlled by a first output from the pair of differential outputs. For example, a transistor can be used to control current, the differential output can be applied to the gate of the transistor to control the amount of current through the transistor. At 606, a second current from a second current source is controlled by a second output from the pair of differential outputs. As with the first current source, the differential output can be applied to a gate of a transistor to control the current through the transistor. At 608 the desires output is obtained by combining the first current and a second current. For example, the currents can be applied to a load to obtain a desired voltage. A switch network can be employed to direct the appropriate amount of current from each current source to the output.

If the methodology is used in a charge pump for a phase locked loop, the output can be applied to a filter and then used as the control voltage for a voltage controlled oscillator. The differential outputs can be used to equalize the currents from the first current source and the second current source so that the current from the first current source is substantially equal to the current of the second current source irrespective of the output voltage. The differential amplifier can be biased by a constant source such as a constant current source.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. A method for implementing a charge pump, comprising:

obtaining a pair of differential outputs from a reference voltage and an output voltage;

controlling a first current from a first current source with a first output from the pair of differential outputs;

controlling a second current from a second current source with a second output from the pair of differential outputs;

obtaining a desired output by combining the first current and a second current; and selectively switching the first current between a node maintained at the reference voltage and a node maintained at the output voltage for adjusting the output voltage.

2. The method for implementing a charge pump as in claim 1, further comprising matching the output voltage with the reference voltage.

3. The method for implementing a charge pump as in claim 1, further comprising filtering the output voltage.

4. The method for implementing a charge pump as in claim 1, further comprising controlling a voltage controlled oscillator with the output voltage.

5. The method for implementing a charge pump as in claim 1, further comprising selectively switching the second current between the node maintained at the reference voltage and the node maintained at the output voltage for adjusting the output voltage.

6. The method of implementing a charge pump as in claim 1, further comprising supplying a constant current to a differential amplifier with the differential outputs.

7. A charge pump, comprising:
   a first current source connected to an output node and sourcing current to the output node;
   a second current source connected to an output node and sinking current from the output node;
   a differential amplifier producing first and second differential outputs based on an output voltage at the output node, the first differential output being coupled to the first current source and controlling the first current source and the second differential output being coupled to the second current source and controlling the second current source;
   a first switch network receiving the first current and having outputs connected to a node supplying a reference voltage and the output node, wherein the first switch network is operable to selectively switch current from the first current source between the node supplying the reference voltage and the output node to adjust the output voltage; and
   a voltage follower, the voltage follower configured to track the output voltage and adjust the reference voltage accordingly.

8. The charge pump of claim 7, wherein the voltage follower comprises an operational amplifier, the output of the operational amplifier being fedback to an input of the operational amplifier.

9. The charge pump of claim 8, wherein the output node of the operational amplifier is the reference voltage that is fedback to the input receiving the reference voltage.

* * * * *